(12) United States Patent
Deboer et al.

(10) Patent No.: US 6,988,871 B2
(45) Date of Patent: Jan. 24, 2006

(54) HEAT SINK ATTACHMENT CLIP

(75) Inventors: Steven Deboer, Brantford (CA); Alin Ila, Kitchener (CA); Kevin O'Neill, Cambridge (CA); Ross Armstrong, Cambridge (CA)

(73) Assignee: Tyco Electronics Canada Ltd., Ontario (CA)

( * ) Notice: Subject to any disclaimer, the term of this patent is extended or adjusted under 35 U.S.C. 154(b) by 57 days.

(21) Appl. No.: 10/402,700

(22) Filed: Mar. 31, 2003

(65) Prior Publication Data

US 2003/0209341 A1 Nov. 13, 2003

Related U.S. Application Data

(60) Provisional application No. 60/377,621, filed on May 6, 2002.

(51) Int. Cl.
*F01D 11/00* (2006.01)

(52) U.S. Cl. .................. 415/176; 361/704; 24/296; 24/458

(58) Field of Classification Search ................ 415/176; 16/223, 371; 257/719; 24/296, 458; 248/510; 361/704
See application file for complete search history.

(56) References Cited

U.S. PATENT DOCUMENTS

| | | | |
|---|---|---|---|
| 6,049,457 A | 4/2000 | Lee | |
| 6,061,239 A * | 5/2000 | Blomquist | 361/704 |
| 6,082,440 A * | 7/2000 | Clemens et al. | 165/80.3 |
| 6,201,697 B1 | 3/2001 | McCullough | |
| 6,414,848 B1 | 7/2002 | Chen | |
| 6,421,242 B1 | 7/2002 | Chen | |
| 6,430,051 B1 | 8/2002 | Yang et al. | |
| 6,480,384 B2 * | 11/2002 | Lo | 361/704 |
| 2002/0036891 A1 | 3/2002 | Lo | |

FOREIGN PATENT DOCUMENTS

GB 2131623 6/1984

* cited by examiner

*Primary Examiner*—Hoang Nguyen

(57) ABSTRACT

A heat sink attachment clip for attaching a heat sink assembly to a frame, the heat sink attachment clip includes a pair of attachment brackets. Each attachment bracket has one or more attachment legs and each attachment leg has a clip attachment means for engagement with a corresponding frame attachment means. A levered cam is used to bear on heat sink assembly. The levered cam is moveable from a first position in which the levered cam does not press the heat sink assembly against the frame to a second position in which the levered cam the heat sink assembly presses the heat sink assembly against the frame. A a handle connects the levered cams of the two attachment clips so that movement of the handle engages both levered cams simultaneously.

16 Claims, 6 Drawing Sheets

HEAT SINK ATTACHMENT CLIP

The present application claims the benefit of convention priority from U.S. Provisional Patent Application Ser. No. 60/377,621 filed on May 6, 2002.

FIELD OF THE INVENTION

The invention relates generally to the mechanics of integrated circuit heat sinks, and more specifically to a heat sink mounting mechanism.

BACKGROUND OF THE INVENTION

Packaging integrated circuits such that they can be easily and reliably connected to an external circuit requires a mechanism capable of making a large number of required electrical connections in a manner that is secure and electrically reliable. Furthermore, the large amount of heat produced by many such integrated circuits must be dissipated, and therefore must be accounted for in designing the integrated circuit mounting and packaging systems.

As integrated circuits increase in complexity, they become more difficult to heat sink adequately. Faster integrated circuits with denser internal circuitry produce more heat over a given physical area than previous generations of integrated circuits. Also, the greater amount of circuitry on denser integrated circuits are likely to require heat sinks that are physically larger than the top surface of the integrated circuit or that have other larger or more complex geometries.

Large heat sinks capable of dissipating many tens of watts of power converted to heat by integrated circuits can cause unacceptable forces on the integrated circuits when mounted directly to the integrated circuit package. For example, such systems may be required to withstand physical shock of up to 50 g, or 50 times the acceleration of gravity, without undue physical stress. When this type of physical shock is applied to a processor with a heavy heat sink attached to it, the weight of the heat sink can cause undue stress, for example, shear stress on the electrical connection pins of the integrated circuit. Also the clips used to hold the heat sink on to the integrated circuit may not be able to retain a heavy heat sink under such heavy acceleration, and so may fail to acceptably secure heavy heat sinks.

Therefore, a device is needed to better support heavy heat sinks. Such a device should transfer the forces applied to a heavy heat sink under heavy acceleration away from the integrated circuit and onto a supporting structure such as a motherboard or securely mounted integrated circuit socket.

Another drawback of existing heat sink attachment clips is that they can be difficult to use. Typically a conventional heat sink attachment clip attaches at two or four points. Ensuring that all attachment points are properly engaged by the clip can be an awkward and time consuming task. Furthermore, removal of an attached clip, for example, to replace a component or to allow service access can be even more difficult as the latching mechanism used is biased to a latched position and it is difficult to access the attachment point and more difficult to exert sufficient force to disengage the latching mechanism.

It is desirable for a device for supporting heat sinks such as a heat sink attachment clip to be capable of providing sufficiently high loads against the integrated circuit package to continue to maintain a load against the integrated circuit despite the potential for heavy shock accelerations in the opposite direction, and also to minimize thermal resistance attributed to the joining of the two surfaces.

It is also desirable for a heat sink attachment clip to bee capable of providing sufficiently high loads to the integrated circuit at a fraction of the required installation load; be capable of facilitating rapid system assembly with a minimum of labour without providing undue stress on the assembly operator from the use of poor ergonomic practices and provide easy heat sink clip attach and removal capabilities, preferably without the need of additional tools.

Additionally, a heat sink it is desirable for a heat sink attachment clip to provide low cost heat sink clip integration features for facilitation of heat sink clip/heat sink component assemblies; and avoid causing undue stress on the mounting attachment hardware or accompanying circuit board.

SUMMARY OF THE INVENTION

The present invention is directed to heat sinks primarily for cooling integrated circuits during operation, and particularly to attachment clips for such heat sinks.

The cooling device according to the present invention includes a fan assisted heat sink assembly with an integrated heat sink attachment clip that facilitates a direct attachment of the heat sink to the integrated circuit.

Since the thermal resistance between the heat sink base and the integrated circuit is a significant component of the total heat sink thermal resistance, strategies directed to minimizing this interfacial thermal resistance are required. One strategy is the selection of the type of thermal interface material utilized within this region. An example of an effective thermal interface material is Shinetzu G751 thermal grease. Typically bearing stresses at this interfacial resistance zone range between 10 psi and 80 psi depending upon heat source size and clipping strategy. Interface materials utilized in this region to minimize thermal resistance will typically operate with lower thermal resistances in a manner inversely proportional to bearing stresses. A primary function of the clip attach mechanism of the present invention is to provide sufficiently high bearing stresses against the integrated circuit in order to ensure minimized heat sink thermal resistance, and that these high bearing stresses are maintained over time at normal operating temperature conditions.

The central region of the base of the heat sink is a flat surface with a sufficiently low engineering flatness tolerance. It will engage flatly against the integrated circuit, or alternatively its protective integrated heat spreader component, in order to assist the heat sink in keeping thermal resistance to a minimum and integrated circuit thermal die temperatures as low as physically possible.

Typically a microprocessor solution must be able to survive potential shock requirements that can arise from the impact of dropping the device. These durability requirements may be translated into very high gravitational accelerations (as high as 50 g's) being applied to the device for very short periods of time. One generally known integrated circuit failure mechanism is caused by the momentary separation of the heat sink from the integrated circuit. This momentary separation can result in a significant force on the integrated circuit which can create instantaneous component failure. To prevent such a failure from occurring, the heat sink attachment clip must provide adequate downward force against the integrated circuit to oppose any potentially upward force caused by the gravitational acceleration of the heat sink's weight. Another function of the clip attach mechanism is therefore to ensure protection against durability issues associated with Shock and Vibration Testing.

Advantageously, the heat sink attachment clip of the present invention provides a leveraged method of applying a high bearing pressure load to the integrated circuit. Whereas the clip retention mechanism may require the application of an 80 lb load onto the integrated circuit, the actual mechanical force required to yield the application load might be limited to a more ergonomically friendly value such as less than 15 lbs.

Another advantage of the heat sink attachment clip of the present invention is a common or unitized leveraging system. While prior art solutions might have offered multiple leveraging systems, in order to achieve the final attachment force objective, a single unitized leveraging system would result in assembly efficiency savings, and a high level of potential error proofing.

A further advantage are the design features incorporated into the clip attachment system which could facilitate low cost integrated heat sink solutions, for end use customers.

In addition, the present invention has improved wear resistance feature designs in order to facilitate the repeated assembly and disassembly of the heat sink thermal solution and, therefore facilitate a maintenance or repair requirement for the integrated circuit solution provider.

The incorporation of bearing support and spreading features into the clip attachment mechanism design in order to provide for and eliminate the need for such bearing support features in alternative thermal solution componentry such as in fan assemblies or heat sinks.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention relates to a heat sink attachment clip. A heat sink attachment clip is used to mount a heat sink assembly. A heat sink assembly includes: the heat source, namely, the integrated circuit being cooled; and a heat sink; and, if present, an air movement device such as a fan or blower including any accessory attachments of the air movement device such as top plates. The heat sink clip attaches the heat sink assembly to a frame which includes the underlying motherboard, or any structure which is used to facilitate attachment of the heat sink assembly to the motherboard.

Figure 1:
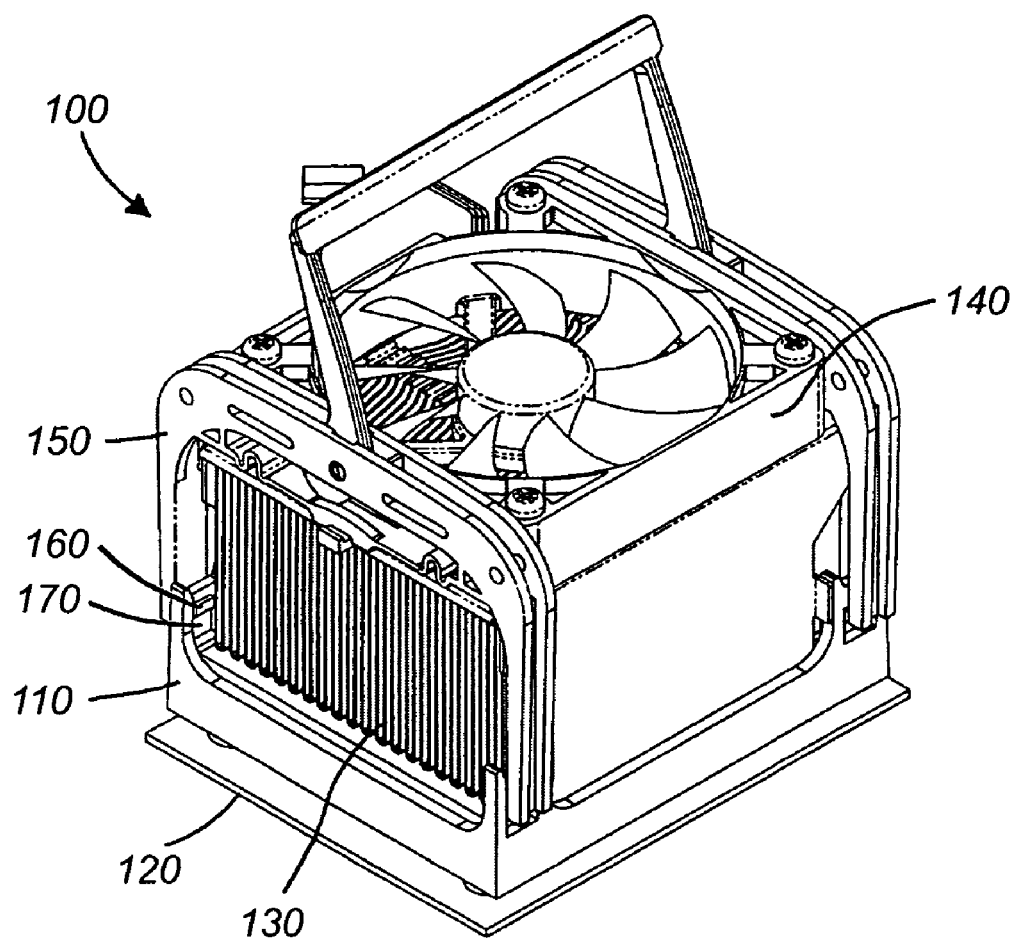
FIG. 1 is a front perspective view of a cooling device, with a heat sink attachment clip according to an embodiment of the present invention.
Figure 2:
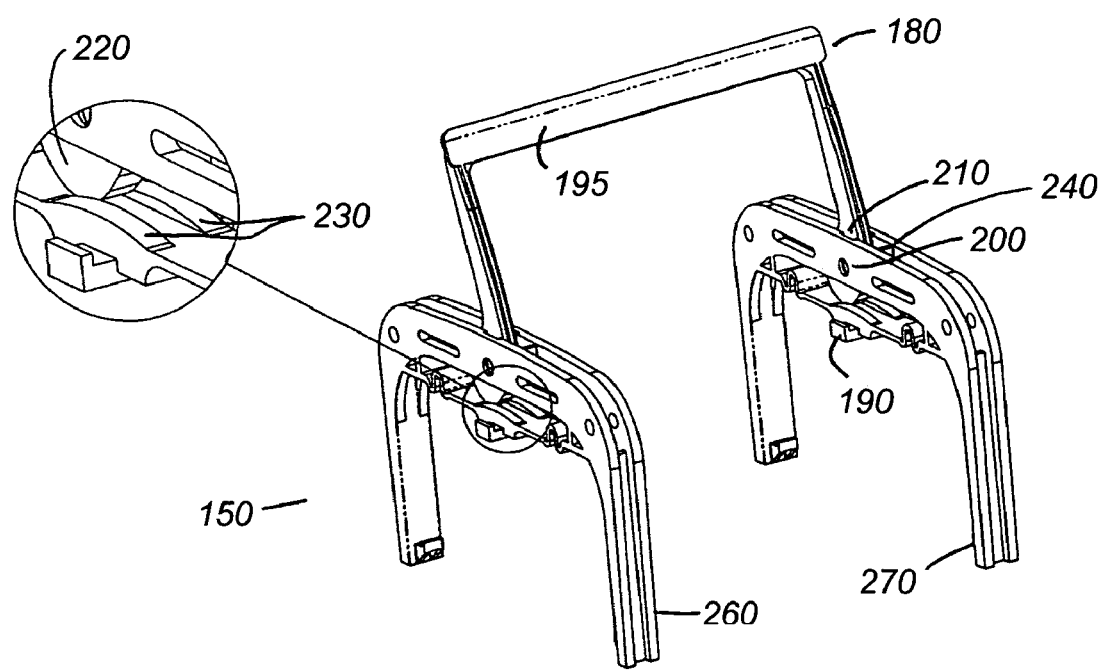
FIG. 2 is a front perspective view of the heat sink attachment clip of FIG. 1.
Figure 3A:
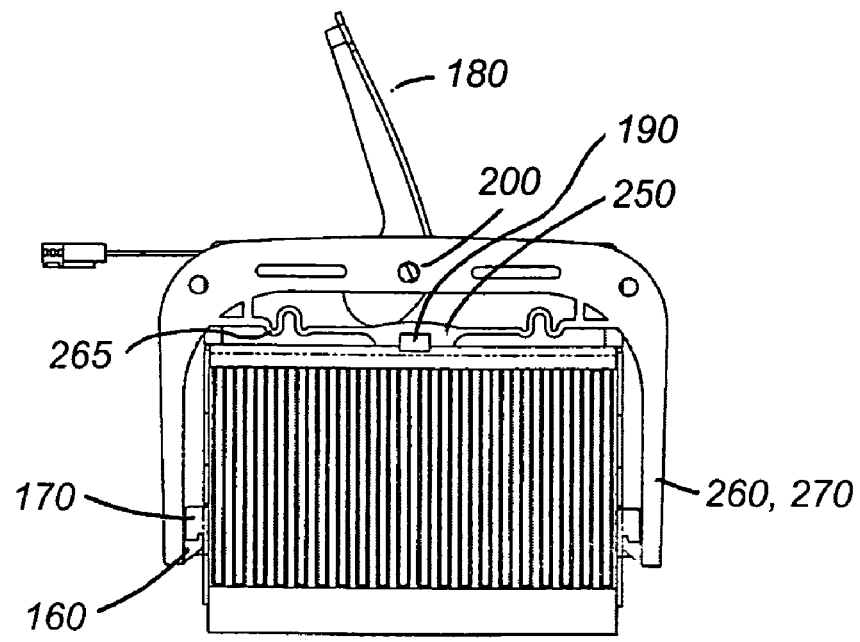
FIG. 3a is a front view of the heat sink attachment clip of FIG. 1 in a disengaged position.
Figure 3B:
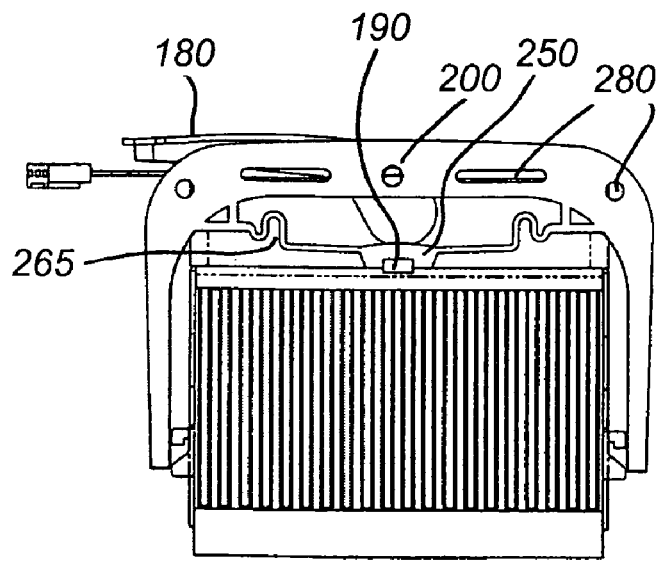
FIG. 3b is a front view of the heat sink attachment clip in an engaged position.

FIGS. 1 to 3 illustrate an embodiment of the present invention. Referring to FIGS. 1 to 3, a cooling device 100 such as a heat sink assembly is used to dissipate heat from an integrated circuit socketed heat source. In FIG. 1, the cooling device 100 interfaces directly with a micro-socketed integrated circuit mounted to the underlying motherboard 120. Affixed also to the motherboard 120 is a retention frame 110 which supports and retains the outer features of the cooling device 100 and which provides the means of ensuring a heat sink attachment clip 150 applies adequate force to the integrated circuit. At the four corners of the retention frame 110, clip attachment mounting points such a recesses or apertures 160 are provided, for clip attachment purposes.

The cooling device 100 of the present embodiment comprises three functional components: i) a high performance heat sink 130 (an example of which is the high aspect ratio folded fin brazed heat sinks supplied by ATS); ii) an integrated axial fan 140 which provides forced air convection within the heat sink; and iii) a heat sink attachment clip 150 which provides effective retention of the heat sink to the integrated circuit socketed heat source mounted to the motherboard 120. The cooling device 100, has these three fundamental functional units integrated together in order to provide an integral thermal solution for integrated circuit cooling.

The illustration in FIG. 1 effectively assists in describing the primary functional features of the heat sink attachment clip 150 to provide a high interface force and bearing pressure to the integrated circuit socketed heat source when the heat sink attachment clip 150 has its clip attachment locking features such as latching members 170 affixed to the retention frame 110 at the corner attachment points or frame apertures 160. FIGS. 1 and 3 illustrate an example attachment mechanism comprising latching members 170 and corresponding recesses or apertures 160 in the frame to receiving the latching members,. Alternatively, the latching member can be found on the frame while the corresponding apertures are formed in the legs of the clip. Generally, any suitable attachment mechanism can be used.

The high bearing pressure of the heat sink to the integrated circuit minimizes thermal resistance associated with this interface, and will significantly affect the effectiveness of the force convection cooled heat sink 130 as a cooling device 100. Another primary functional feature of the heat sink attachment clip 150 is that accelerations associated with potential shock loads of up to 50 gravities, can be counteracted, and a positive contact between the heat sink and the integrated circuit can be maintained, thereby avoiding a potentially destructive failure mode when separation occurs.

In FIGS. 2 and 3, the heat sink attachment clip 150 is described in its entirety in order to effectively explain its secondary functional features that add additional functional value to the end use customer of the cooling device manufacturer.

The heat sink attachment clip 150 comprises three components: a cam lever assembly, a left attachment bracket 260, and a right attachment bracket 270.

The cam lever assembly includes a central handle 195 connecting two levered cam members. The cam lever assembly can be made out any suitable material, however, plastic is used in a preferred embodiment. The central handle is preferably stiffened by the use of longitudinal ribs running along the length of the handle, although any other manner of stiffening such as the choice of material of the handle or thickness of material in the handle can be used. Each levered cam member comprises a cam 220 and an attached cam lever 180.

The attachment of the cam levers 180 to the central handle 195 provides a unitized leveraging system approach. Alternatively, leveraged solutions offered by prior art solution providers had offered multiple lever solutions in order to engage the primary function of the heat sink attachment clip 150. By offering a unitized leveraging approach, additional gains in assembly efficiency are provided, as well as a higher level of potential error proofing.

The attachment brackets 260, 270 while having a separate left hand and right hand configuration, are common in design elements, and are therefore produced in a single injection mould tool. Each of the attachment brackets 260, 270 is U shaped and includes a central bracket body and a pair of legs. Each leg is provided with an attachment means such as a latch 170. Each latch 170 engages a corresponding aperture or recess 170 in the retention frame 110. The central bracket body is provided with flex apertures 280 to allow the attachment bracket to better flex and accommodate the heat sink assembly. The central body includes a longitudinal aperture having a tapered slot 210 into which a levered cam member can be inserted.

On each side of the longitudinal aperture are central attachment holes 200. A corresponding cylindrical protrusion extends from each side of each cam 220. Upon insertion of the cam into the longitudinal aperture, the cylindrical protrusions snap into the central attachment holes. The cam 220 rotates about the axis defined by the cylindrical protrusion. The central attachment hole 200 in this design has been designed with a slight eccentricity incorporated, and is located 1 mm away from the true centre of the plastic clip attachment bracket 260, 270. This incorporated eccentricity facilitates an overcam locking condition in the clip attachment mechanism that prevents the possibility of a disengaging condition occurring in the event of extraordinary shock and vibration test conditions.

This arrangement results in a leveraging mechanism in the heat sink attachment clip 150 which enables the application of loads onto the integrated circuit of a magnitude of 65 to 95 lbs force. This particular leveraging mechanism enables the high load to be applied with a minimum amount of force of approximately 15 lbs of engagement force applied to the cam lever 180 by the central handle 195. Through this leveraging mechanism, an ergonomic attachment solution is facilitated which enables universal ease of assembly by the global workforce.

Located adjacent the cam 220 is a press pad 250. Rotation of the cam 220 by movement of the cam lever to the position shown in FIG. 3b exerts a downward pressure to the press pad 250 which bears against the heat sink. This pressure in conjunction with the tension exerted by the legs latched onto the retention frame ensures that the heat sink fully contacts the integrated circuit. Reverse rotation of the cam to the position show in FIG. 3a releases the downward pressure.

The stiffener protrusion 240 incorporated into attachment brackets 260, 270 provides two separate customer valued added secondary functions. It acts as a stop for the cam lever 180 that limits the travel of the cam lever to a rotation angle of approximately 100 degrees. As FIG. 3 indicates, by limiting this rotation angle, an obvious visual signal is provided of the separate disengaged and engaged clip attachment conditions. The absence of the stiffener protrusion 240 would enable a potential rotation angle of approximately 180 degrees, and a significantly lower detection capability would exist for a potential disengagement operational failure mode if one were to evaluate the design from a failure mode and effect analysis viewpoint. The second function of the stiffener protrusion 240 is to provide a reduced potential failure condition for a cam lever 180 accidentally detaching from the central attachment hole 200. This particular design enhancement would facilitate higher force clip attachment condition (even beyond 95 lbs), and would thereby facilitate even lower interfacial thermal resistance conditions.

FIG. 2 provides a visual representation of a design feature that facilitates the heat sink attachment clip 150 into becoming a component of a more fully integrated cooling device 100 for end use customers. A fan engagement member such as integration facilitating clip 190 is incorporated on both sides of each attachment bracket 260, 270 in order to facilitate a common injection mould tool. This feature however functions as an integration facilitator clip 150 on one side only. As indicated in FIG. 1, in assembling the heat sink attachment onto the top surface of the heat sink 130, the integration facilitator feature 190 seating itself into a protrusion in the top surface of the heat sink 130. The integration facilitating clip 190 is then covered and locked into place by the fan assembly 140 being incorporated into the cooling device 100. The net result of incorporating the integration facilitating clip 190 is the development of a low cost enabler of an integrated solution.

FIG. 2 also provides an enlargement of a design feature which facilitates improved wear resistance as well as uniform load distribution of the heat sink attachment clip 150 when subjected to multiple engage and disengage cycles. The cam 220 of cam lever assembly is provided with supplementary lateral support by the incorporation of engagement wall 230 to ensure additional lateral stability of cam portion 220 under high loading conditions. The walls 230 define a channel for receiving the cam 220 and guiding its movement. The inclusion of walls 230 increases the ability of the heat sink attachment clip 150 to withstand repeated engage/disengage cycles. In order to facilitate normal integrated circuit solution provider maintenance and repair specification requirements, the incorporation of such wear resistance design features adds to the reliability of the design.

FIG. 3 also provides an example of the function and operation of the press pad 250 and press pad support 265 incorporated into the clip design during both an engaged and disengaged mode of operation. The press pad 250 provides adequate bearing support to the heat sink 130, and eliminates the need to have such bearing support features being incorporated into the alternative thermal solution components such as in the fan assembly 140 or in the heat sink 130.

FIG. 3 also depicts flex apertures 280 allow control and enable modification of the stiffness of the clip, for example, during manufacture. The flex apertures enable customization the spring stiffness of the heat sink attachment clip, to facilitate optimal clip force variation conditions given normal integrated circuit device assembly variation conditions.

Figure 4:
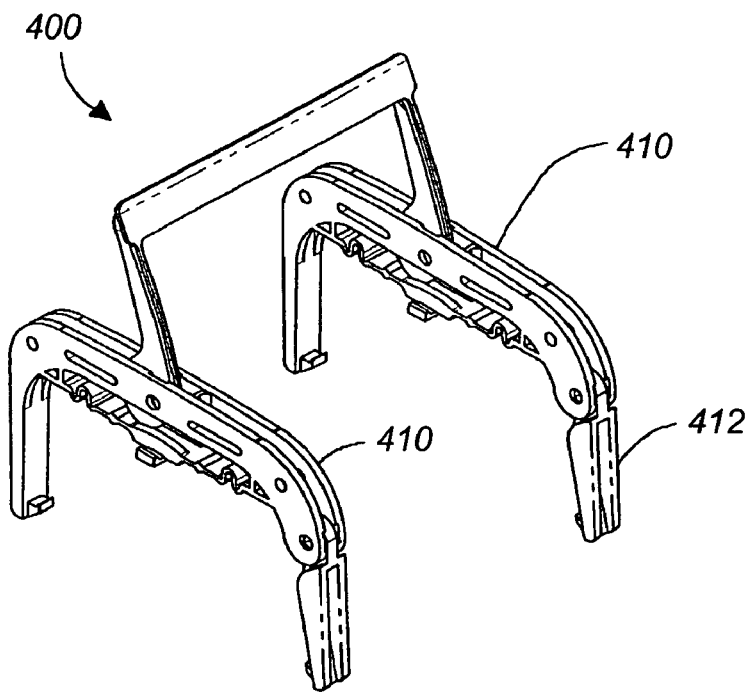
FIG. 4 is a perspective of an alternative embodiment of a heat sink attachment clip.
Figure 5:
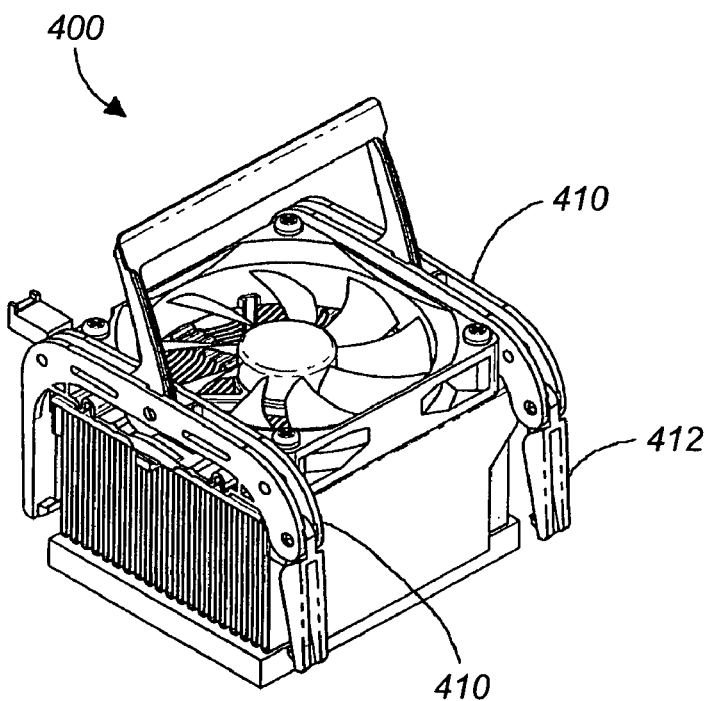
FIG. 5 is a view of the heat sink attachment clip of FIG. 4 in use with a heat sink.

FIGS. 4 and 5 show an alternative embodiment of the present invention. Referring to FIG. 4, the heat sink attachment clip 400 includes attachment brackets 410. Each attachment bracket includes an articulated or hinged leg 412. The hinged leg is moveable between an disengaged position away from the heat sink to an engaged position in which it engages the heat sink. FIG. 5 illustrates the clip 400 of FIG.

4 in an engaged position. This facilitates the engagement of the clip with the heat sink during assembly. During subsequent rework or replacement of the heat sink, the leg is moved to the disengaged position to facilitate removal of the spring clip and access to the heat sink and microprocessor.

Figure 6:
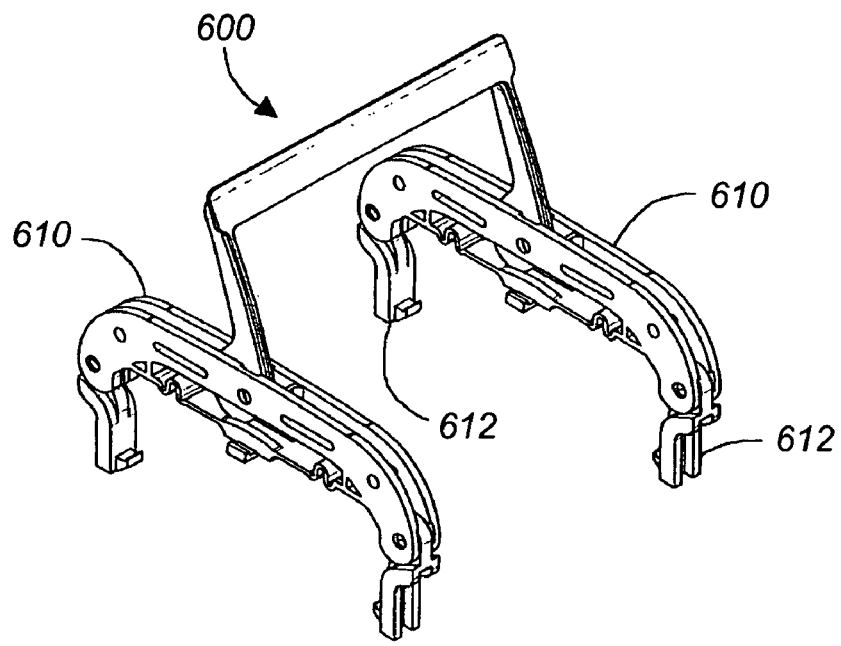
FIG. 6 is a perspective view of another embodiment of a heat sink attachment clip.
Figure 7:
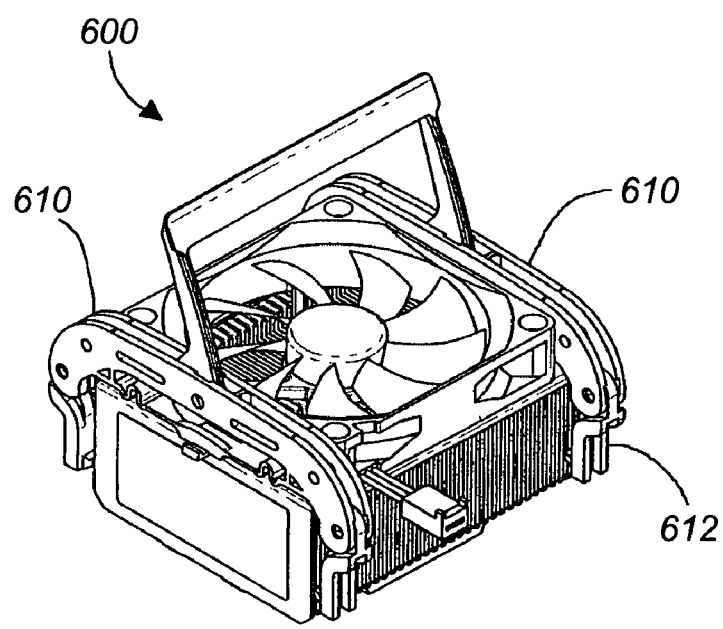
FIG. 7 is a view of the heat sink attachment clip of FIG. 6 in use with a heat sink.

FIGS. 6 and 7 illustrate another embodiment of the present invention. Referring to FIG. 6, the heat sink attachment clip 600 includes attachment brackets 610. Each attachment bracket includes a pair of articulated or hinged legs 612 to facilitate initial assembly of the heat sink assembly and subsequent removal of the spring clip from the heat sink assembly. FIG. 7 illustrates the clip 600 of FIG. 6 in an engaged position.

Figure 8:
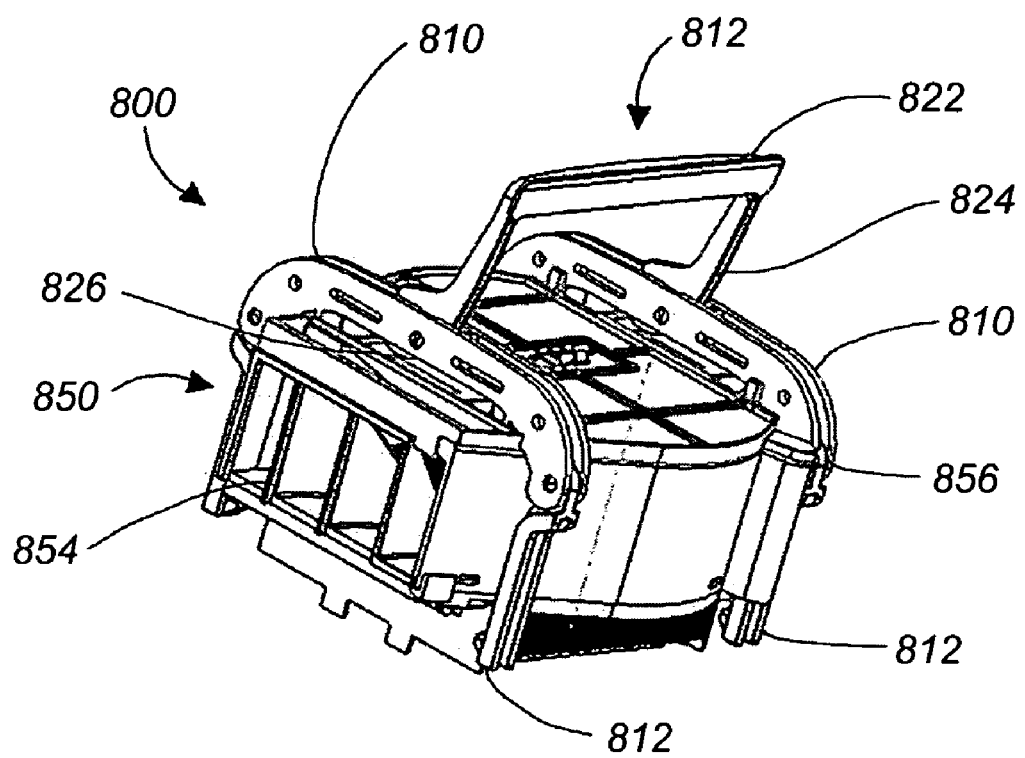
FIG. 8 is a perspective view of another alternative embodiment of a heat sink attachment clip in use with a heat sink.

Referring to FIG. 8, an alternative embodiment of the present invention is illustrated in which the heat sink attachment clip 800 comprises attachment brackets 810 having hinged legs 812. The cam lever assembly 820 includes a central handle 822 and levered cam members 824. In this embodiment, the cams 826 bear directly on the heat sink assembly 850 which includes a heat sink 852, an air moving device such as a blower 854 or a fan and a heat source such as an integrated circuit (not shown). In the present embodiment, the air moving device includes a top plate 856. When the heat sink clip 800 is engaged, the cams 826 bear on the top plate 856 of the blower 854 rather than on press pads as described in earlier embodiments.

Although the present invention has been described in detail by way of example, other variations are fully contemplated by the present invention. According to alternative embodiments of the present invention, a different type of commercially available thermal interface material can be utilized. The present invention can also be used with heat sinks of alternative constructions. The retention frame of the heat sink attachment clip can be differently constructed.

The present invention also contemplates heat sink attachment clips designed with a variety of clip attachment force configurations in mind, and with a variety of clip attachment mounting point configurations. The present invention further contemplates a heat sink attachment clip with a design enhancement in which outside embodied legs are joined in the center for a common central attachment configuration. That is, although not illustrated in the accompanying drawings, the legs of opposing U-shapes, instead of extending straight down to separate attachment points, could angle towards each other and join to form a single downwardly-projecting leg, i.e. the legs of opposing U-shapes (as seen from one side) forming Y-shapes (or T-shapes) as seen from a side at 90 degrees.

The example embodiments of the present invention discussed above provide for an engagement actuator in the form of a cam lever mechanism provided on each of two attachment clips. The two cam lever mechanisms are connected by the use of a handle so that movement of the handle simultaneously engages or disengages the attachment legs of the attachment brackets to the corresponding frame attachment means. Alternatively, any suitable actuator mechanism can be used with the handle connecting the actuator mechanisms of each attachment bracket for simultaneous engagement or disengagement of the attachment legs of the attachment brackets to the corresponding frame attachment means.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A heat sink attachment clip for attaching a heat sink assembly to a frame, the heat sink attachment clip comprising:
   a pair of attachment brackets;
   each attachment bracket having one or more attachment legs;
   each attachment leg having a clip attachment means for engagement with a corresponding frame attachment means;
   each attachment bracket having a levered cam for bearing on heat sink assembly, the levered cam moveable from a first position in which the levered cam does not press the heat sink assembly against the frame to a second position in which the levered cam the heat sink assembly presses the heat sink assembly against the frame; and
   a handle connecting the levered cams of the two attachment brackets so that movement of the handle engages both levered cams simultaneously.

2. The heat sink attachment clip of claim 1, wherein the one or more attachment legs comprises two attachment legs.

3. The heat sink attachment clip of claim 1, wherein one of one or more attachment legs of each bracket is hinged, each attachment hinged leg moveable between a first position in which the clip attachment means engages the frame attachment means and a second position in which the clip attachment means does not engage the frame attachment means.

4. The heat sink attachment clip of claim 1, wherein both of the attachment legs of each bracket is hinged, each hinged attachment leg moveable between a first position in which the clip attachment means engages the frame attachment means and a second position in which the clip attachment means does not engage the frame attachment means.

5. The heat sink attachment clip of claim 1, wherein the handle is rigid.

6. The heat sink attachment clip of claim 5, wherein the handle comprises stiffening ribs.

7. The heat sink attachment clip of claim 1, wherein the engagement surface comprises a cam walls defining a channel in which the levered cam is seated.

8. The heat sink attachment clip of claim 1, wherein the cam walls guide the movement of the levered cam to prevent sideways movement of the levered cam.

9. The heat sink attachment clip of claim 1, wherein the cam is mounted off-centre the attachment brackets to enable an overcamming action.

10. The heat sink attachment clip of claim 1, further comprising a fan engagement member for resisting relative movement of the heat sink attachment clip and the fan.

11. The heat sink attachment clip of claim 1, wherein the clip is made of plastic.

12. The heat sink attachment clip of claim 1, wherein the clip is made of metal.

13. A heat sink attachment clip for attaching a heat sink assembly to a frame, the heat sink attachment clip comprising:
   a pair of attachment brackets;
   each attachment bracket having two attachment legs;
   each attachment leg having an clip attachment means for engagement with one of four corresponding frame attachment means at four attachment points on the frame;
   each attachment bracket having a heat sink engagement surface adjacent the heat sink assembly;

each attachment bracket having a levered cam for bearing on the engagement surface to press against the heat sink assembly, the levered cam moveable from a first position in which the engagement surface does not engage the engagement surface to a second position in which the cam bears on the engagement surface which bears on the heat sink; and a single throw lever for effecting engagement of the attachment brackets by causing the attachment clip to bear against the heat sink assembly while substantially simultaneously exerting tension at the four attachment points using the four attachment legs.

14. The heat sink attachment clip of claim 13, wherein the single throw lever further comprises a single throw lever for effecting disengagement of the attachment brackets by releasing the attachment clip from the heat sink assembly and substantially simultaneously removing the tension at the four attachment points.

15. A heat sink attachment clip for attaching a heat sink assembly to a frame, the heat sink attachment clip comprising:
   a pair of attachment brackets;
   each attachment bracket having one or more attachment legs;
   each attachment leg having a clip attachment means for engagement with a corresponding frame attachment means;
   a heat sink press pad adjacent the heat sink;
   a levered cam for bearing on the press pad to press against the heat sink assembly, the levered cam moveable from a first position in which the press pad does press the heat sink assembly against the frame to a second position in which the cam bears on the pressure pad which presses the heat sink assembly against the frame; and
   a handle connecting the levered cams of the two attachment clips so that movement of the handle engages both levered cams simultaneously.

16. A heat sink attachment clip for attaching a heat sink assembly to a frame, the heat sink attachment clip comprising:
   a pair of attachment brackets;
   each attachment bracket having one or more attachment legs;
   each attachment leg having a clip attachment means for engagement with a corresponding frame attachment means;
   an engagement actuator for each of the attachment brackets for engaging the attachment leg of the attachment bracket to the corresponding frame means; and
   a handle connecting the engagement actuators so that movement of the handle simultaneously engages the attachment legs to the corresponding frame attachment means.

* * * * *